United States Patent
Takahashi et al.

(10) Patent No.: US 11,393,906 B2
(45) Date of Patent: Jul. 19, 2022

(54) CRYSTALLINE OXIDE SEMICONDUCTOR FILM AND SEMICONDUCTOR DEVICE

(71) Applicant: FLOSFIA INC., Kyoto (JP)

(72) Inventors: Isao Takahashi, Kyoto (JP); Takashi Shinohe, Kyoto (JP); Rie Tokuda, Kyoto (JP); Masaya Oda, Kyoto (JP); Toshimi Hitora, Kyoto (JP)

(73) Assignee: FLOSFIA INC., Kyoto (JP)

( * ) Notice: Subject to any disclaimer, the term of this patent is extended or adjusted under 35 U.S.C. 154(b) by 0 days.

(21) Appl. No.: 16/347,360

(22) PCT Filed: Nov. 7, 2017

(86) PCT No.: PCT/JP2017/040039
§ 371 (c)(1),
(2) Date: May 3, 2019

(87) PCT Pub. No.: WO2018/084304
PCT Pub. Date: May 11, 2018

(65) Prior Publication Data
US 2019/0305091 A1    Oct. 3, 2019

(30) Foreign Application Priority Data

Nov. 7, 2016 (JP) .............................. JP2016-217661
Jul. 13, 2017 (JP) .............................. JP2017-137447

(51) Int. Cl.
*H01L 29/227* (2006.01)
*H01L 21/02* (2006.01)
(Continued)

(52) U.S. Cl.
CPC ............ *H01L 29/227* (2013.01); *C23C 16/40* (2013.01); *C30B 25/02* (2013.01); *C30B 29/16* (2013.01);
(Continued)

(58) Field of Classification Search
CPC .............. H01L 29/47; H01L 21/02576; H01L 21/02565; H01L 21/02433; H01L 29/45; H01L 29/227; H01L 29/872
See application file for complete search history.

(56) References Cited

U.S. PATENT DOCUMENTS 8,310,029 B2 * 11/2012 Fujikura ............... C30B 25/183
257/615
10,439,028 B2  10/2019 Hitora et al.
(Continued)

FOREIGN PATENT DOCUMENTS

JP      2013-28480      2/2013
JP      2015-228495     12/2015
(Continued)

OTHER PUBLICATIONS

Zhao et al., ("growth and characterization of α-phase Ga2—xSnxO3 . . . ") Semi. Sci. Technol. 31 (Year: 2016).*
(Continued)

*Primary Examiner* — Ahmed N Sefer
(74) *Attorney, Agent, or Firm* — Wenderoth, Lind & Ponack, L.L.P.

(57) ABSTRACT

A crystalline oxide semiconductor film with an enhanced electrical property is provided. By use of a mist CVD apparatus, a crystalline oxide semiconductor film with a corundum structure and a principal plane that is an a-plane or an m-plane was obtained on a crystalline substrate by atomizing a raw-material solution containing a dopant that is an n-type dopant to obtain atomized droplets, carrying the atomized droplets by carrier gas onto the crystalline substrate that is an a-plane corundum-structured crystalline substrate or an m-plane corundum-structured crystalline substrate placed in a film-formation chamber, and the atom-
(Continued)

ized droplets were thermally reacted to form the crystalline oxide semiconductor film on the crystalline substrate.

20 Claims, 8 Drawing Sheets

(51) Int. Cl.

| | | |
|---|---|---|
| H01L 29/04 | (2006.01) | |
| C30B 25/02 | (2006.01) | |
| H01L 29/78 | (2006.01) | |
| H01L 29/778 | (2006.01) | |
| H01L 29/808 | (2006.01) | |
| H01L 29/872 | (2006.01) | |
| H01L 29/812 | (2006.01) | |
| H01L 29/12 | (2006.01) | |
| C23C 16/40 | (2006.01) | |
| C30B 29/16 | (2006.01) | |
| H01L 29/739 | (2006.01) | |
| H01L 29/24 | (2006.01) | |

(52) U.S. Cl.
CPC ...... *H01L 21/02433* (2013.01); *H01L 29/045* (2013.01); *H01L 29/12* (2013.01); *H01L 29/24* (2013.01); *H01L 29/739* (2013.01); *H01L 29/778* (2013.01); *H01L 29/78* (2013.01); *H01L 29/808* (2013.01); *H01L 29/812* (2013.01); *H01L 29/872* (2013.01)

(56) References Cited

U.S. PATENT DOCUMENTS

| | | | |
|---|---|---|---|
| 2010/0006836 A1* | 1/2010 | Koukitu | C23C 16/0272 257/43 |
| 2012/0045661 A1 | 2/2012 | Kumaran et al. | |
| 2014/0217470 A1 | 8/2014 | Sasaki et al. | |
| 2015/0279927 A1* | 10/2015 | Hitora | H01L 29/04 257/43 |
| 2015/0325659 A1* | 11/2015 | Hitora | H01L 29/7393 257/43 |
| 2017/0200790 A1* | 7/2017 | Hitora | H01L 29/872 |
| 2017/0278706 A1* | 9/2017 | Oda | H01L 29/7395 |

FOREIGN PATENT DOCUMENTS

| | | |
|---|---|---|
| JP | WO2016/035696 | 3/2016 |
| JP | 2016-201540 | 12/2016 |
| WO | 2016/013554 | 1/2016 |
| WO | WO-2016013554 A1 * | 1/2016 ........... H01L 29/778 |
| WO | WO 2016/035696 * | 3/2016 |

OTHER PUBLICATIONS

Kaneko et al. ("Kaneko") ("Growth and metal-oxide-semiconductor field-effect transistors of corundum-structured alpha indium oxide semiconductors,") Applied Physics Express. (Year: 2015).*
Rauf ("Rauf") ("Low resistivity and high mobility tin-doped indium oxide films,") Materials Letters 18 123-127 (Year: 1993).*
Zhao et al., ("Impurity Compensation Effect Induced by Tin Valence Change in a-Ga1.4Sno.6O3 Thin Films," ACS Applied Materials & Interfaces 983-988). (Year: 2016).*
International Search Report dated Dec. 26, 2017 in International (PCT) Application No. PCT/JP2017/040039 with English translation.
Written Opinion of the International Searching Authority dated Dec. 26, 2017 in International (PCT) Application No. PCT/JP2017/040039 with English translation.
Kentaro Kaneko, "Growth and physical properties of corundum-structured gallium oxide alloy thin films", Dissertation, Kyoto Univ., Mar. 2013, pp. 1-116, with English language abstract.
Kazuaki Akaiwa, "Conductivity control and device applications of corundum-structured gallium oxide-based Semiconductor", Dissertation, Kyoto Univ., Mar. 2016, pp. 1-81, with English language abstract.
Raveen Kumaran, "New Solid State Laser Crystals Created by Epitaxial Growth", B.A.Sc, The University of British Columbia, Sep. 2012, pp. 1-172.
Extended European Search Report dated Jun. 16, 2020 in European Application No. 17867324.0.
Hiroyuki Nishinaka et al., "Epitaxial growth of $\alpha$-$Ga_2O_3$ thin films on a-, m-, and r-plane sapphire substrates by mist chemical vapor deposition using $\alpha$-$Fe_2O_3$ buffer layers", Materials Letters, vol. 205, Jun. 2, 2017, pp. 28-31.
Office Action dated Nov. 25, 2020 in corresponding Chinese Application No. 201780068749.1, with English Translation.
Office Action dated Dec. 7, 2020 in corresponding Indian Application No. 201917018252.
Communication pursuant to Article 94(3) EPC dated May 30, 2022, in corresponding European Patent Application No. 17867324.0.
Riena Jinno et al. "Reduction in edge dislocation density in corundum-stinctured $\alpha Ga_2O_3$ layers on sapphire substrates with quasi-graded $\alpha$-$(Al,Ga)_2O_3$ buffer layers", Applied Physics Express, vol. 9, No. 7, 2016, p. 071101-1 to 071101-4.

* cited by examiner

CRYSTALLINE OXIDE SEMICONDUCTOR FILM AND SEMICONDUCTOR DEVICE

TECHNICAL FIELD

The present inventive subject matter relates to a crystalline oxide semiconductor film, which is useful for a semiconductor device. Also, the present inventive subject matter relates to a semiconductor device including the crystalline oxide semiconductor film, and also relates to a semiconductor system including the crystalline oxide semiconductor film.

BACKGROUND ART

As a switching device of the next generation achieving a high withstand voltage, a low loss, and high temperature resistance, a semiconductor device using gallium oxide ($Ga_2O_3$) with a large band gap attracts attention and is expected to be applied to power semiconductor devices including an inverter. Also, gallium oxide is expected to be applied to a light emitting and/or receiving element such as a light emitting diode (LED) and a sensor, due to a wide band gap of gallium oxide. According to NPL 1, such gallium oxide has a band gap that may be controlled by forming mixed crystal with indium or aluminum singly or in combination and such a mixed crystal is an extremely attractive material as an InAlGaO-based semiconductor. Here, InAlGaO-based semiconductors refer to $In_XAl_YGa_ZO_3$ ($0 \leq X \leq 2$, $0 \leq Y \leq 2$, $0 \leq Z \leq 2$, $X+Y+Z=1.5\sim2.5$) and can be viewed as the same material system containing gallium oxide.

Patent Document 1 describes a highly crystalline and electrically-conductive $\alpha$-$Ga_2O_3$ film that is doped with Sn and formed on a c-plane sapphire substrate. The film described in Patent Document 1 had a high crystallinity with a full width at half maximum of rocking curve by X-ray diffraction measurement that is approximately 60 arcsec, however, was still difficult to maintain breakdown voltage performance, and insufficient in semiconductor properties such as mobility that was 1 $cm^2/Vs$ or less.

Also, Patent Document 2 describes an $\alpha$-$Ga_2O_3$ film doped with Ge and formed on a c-plane sapphire substrate, and the $\alpha$-$Ga_2O_3$ film was superior in electric properties to the $\alpha$-$Ga_2O_3$ film described in Patent Document 1. However, the mobility of the $\alpha$-$Ga_2O_3$ film was 3.26 $cm^2/Vs$, which was still insufficient for a semiconductor device.

In Non-Patent Document 2, an $\alpha$-$Ga_2O_3$ film doped with Sn was formed on a c-plane sapphire substrate, and then, the $\alpha$-$Ga_2O_3$ film was annealed to become an annealed buffer layer. By forming an $\alpha$-$Ga_2O_3$ film doped with Sn on the annealed buffer layer, mobility was enhanced. In addition, Sn doped into the $\alpha$-$Ga_2O_3$ film acts as a kind-of surfactant, the surface roughness and the crystallinity of the $\alpha$-$Ga_2O_3$ film were improved and the mobility was enhanced as a result. However, there were still problems that the annealing treatment increases the resistance of the film or makes the film electrically-insulated, and thus, the film had problems to be used for the semiconductor device. Also, since the obtained film still has a number of dislocations, and the influence of scattering dislocations was great, and that tends to affect the electrical characteristics negatively. Furthermore, there is also a problem of many cracks, and thus, an industrially useful $\alpha$-$Ga_2O_3$ film has been desired.

Patent Literature

Patent Document 1: JP2013-028480
Patent Document 2: JP2015-228495

Non-Patent Literature

NPL 1: Kaneko, Kentaro, "Fabrication and physical properties of corundum structured alloys based on gallium oxide", Dissertation, Kyoto Univ., March 2013.
NPL2: Akaiwa, Kazuaki, "Conductivity control and device applications of corundum-structured gallium oxide-based semiconductor", Dissertation, Kyoto Univ., March 2016.

SUMMARY OF INVENTION

Technical Problem

An object of the present inventive subject matter is to provide a crystalline oxide semiconductor film with enhanced electrical characteristics, particularly mobility.

Solution to Problem

As a result of intensive investigations to achieve the above object, the present inventors found that a crystalline oxide semiconductor film formed under specified conditions by use of a mist CVD method surprisingly obtained enhanced mobility even without performing a treatment that gives high resistance and makes the crystalline oxide semiconductor film insulative, and also, even if the crystalline oxide semiconductor film has a full width at half maximum of 100 arcsec or more, for example. Furthermore, the crystalline oxide semiconductor film that was obtained was found to have decreased number of cracks and to solve the above-mentioned problem(s). Also, the inventors obtained the knowledge above, further investigated and completed the present inventive subject matter.

That is, the present inventive subject matter relates to followings.

[1] A crystalline oxide semiconductor film includes a corundum-structured crystalline oxide semiconductor as a major component; a dopant that is an n-type dopant; and a principal plane that is an a-plane or an m-plane.
[2] The crystalline oxide semiconductor film of [1], wherein the crystalline oxide semiconductor film includes carrier concentration that is $1.0 \times 10^{18}/cm^3$ or more.
[3] The crystalline oxide semiconductor film of [1] or [2], wherein the crystalline oxide semiconductor film comprises mobility that is 30 $cm^2/Vs$ or more.
[4] The crystalline oxide semiconductor film of [1] to [3], wherein the crystalline oxide semiconductor film comprises a full width at half maximum of 300 arcsec or more.
[5] wherein the crystalline oxide semiconductor film of [1] to [4] has electrical resistivity that is 50 m$\Omega$cm or less.
[6] The crystalline oxide semiconductor film of any of [1] to [5], wherein the crystalline oxide semiconductor film includes an off-angle.
[7] The crystalline oxide semiconductor film of any of [1] to [6], wherein the dopant contains tin, germanium, or silicon.
[8] The crystalline oxide semiconductor film of any of [1] to [7], wherein the dopant comprises tin.
[9] The crystalline oxide semiconductor film of any of [1] to [8], wherein the crystalline oxide semiconductor comprises gallium, indium, or aluminum.

[10] The crystalline oxide semiconductor film of any of [1] to [9], wherein the crystalline oxide semiconductor contains at least gallium.
[11] A semiconductor device includes at least an electrode and the crystalline oxide semiconductor film of any of [1] to [10] as a semiconductor layer; and an electrode.
[12] A semiconductor system includes the semiconductor device of [11].

Advantageous Effect of the Invention

Crystalline oxide semiconductor films according to a present inventive subject matter include enhanced electrical properties, and are particularly enhanced in mobility.

DESCRIPTION FOR CARRYING OUT PRESENT INVENTIVE SUBJECT MATTER

Figure 1:
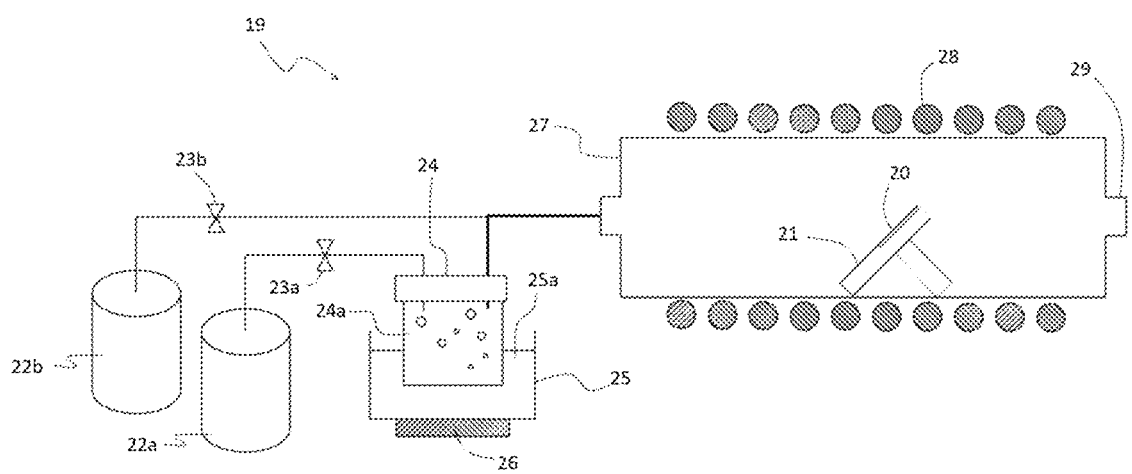
FIG. 1 shows a schematic diagram of a film-formation apparatus as mist CVD apparatus.

The crystalline oxide semiconductor film of a present inventive subject matter is a crystalline oxide semiconductor film containing as a major component a crystalline oxide semiconductor with a corundum structure, further containing a dopant that is an n-type dopant, and a principal plane that is an a-plane or an m-plane. Also, the crystalline oxide semiconductor film of the present inventive subject matter preferably has a carrier concentration that is $1.0 \times 10^{18}/cm^3$ or more. The principal plane is not particularly limited as long as the principal plane is an a-plane or an m-plane, however, according to the present inventive subject matter, the principal plane is preferably an m-plane. Also, the carrier concentration herein means a carrier concentration obtained by a Hall effect measurement in the crystalline oxide semiconductor film. The upper limit of the carrier concentration is not particularly limited, however, the carrier concentration is preferably $1.0 \times 10^{23}/cm^3$ or less, and further preferably $1.0 \times 10^{22}/cm^3$ or less. The crystalline oxide semiconductor film has mobility that is 30 $cm^3/Vs$ or more, further preferably 50 $cm^3/Vs$ or more, and most preferably 100 $cm^3/Vs$ or more. The mobility herein means a mobility obtained by a Hall effect measurement. Also, according to a present inventive subject matter, the crystalline oxide semiconductor film has a resistivity that is 50 mΩcm or less, further preferably 10 mΩcm or less, or further preferably 5 mΩcm or less.

The crystalline oxide semiconductor film preferably includes an off-angle. The term "off-angle" herein means an angle of inclination to a crystalline plane (principal plane) that is a reference plane, and usually the term "off-angle" is used as an inclination angle formed by the crystalline plane (principal plane) and a crystalline growth surface. The direction of inclination of "off-angle" is not particularly limited, however, according to the present inventive subject matter, if the crystalline plane (principal plane) is an m-plane with an off-angle, the off-angle is preferably inclined to the direction of an a-axis from the reference plane. The "off-angle" is not particularly limited, however, preferably in a range of 0.2° to 12.0°, further preferably 0.5° to 4.0°, and most preferably 0.5° to 3.0°. If the crystalline oxide semiconductor film includes an off-angle that is in a preferable range, semiconductor properties, especially in mobility, are enhanced.

Also, according to a present inventive subject matter, the crystalline oxide semiconductor may preferably contain indium, gallium or aluminum, and further preferably contains InAlGaO-based semiconductor. The crystalline oxide semiconductor most preferably contains at least gallium. The term "major component" herein means, for example, if a crystalline oxide semiconductor of a crystalline oxide semiconductor film is $\alpha$-$Ga_2O_3$, $\alpha$-$Ga_2O_3$ is contained in the crystalline oxide semiconductor film under the condition that the atomic ratio of gallium in all metal elements contained in the crystalline oxide semiconductor film is 0.5 or more. According to a present inventive subject matter, the atomic ratio of gallium in all metal elements contained in a crystalline oxide semiconductor film is preferably 0.7 or more, and further preferably 0.8 or more. The thickness of the crystalline oxide semiconductor film is not particularly limited, and may be 1 μm or less, and also may be 1 μm or more. The shape of the crystalline oxide semiconductor film is not particularly limited, and the crystalline oxide semiconductor film may be a quadrangle including a rectangular shape and a square shape. Also, the shape of the crystalline oxide semiconductor film may be a circular shape including a semicircle, for example. Furthermore, the shape of the first semiconductor film may be a polygonal shape. The surface area of the crystalline oxide semiconductor film may not be particularly limited, however, the surface area of the first semiconductor layer may be 3 mm square or more, and preferably 5 mm square or more. The crystalline oxide semiconductor film is most preferably 50 mm or more in diameter. According to a present inventive subject matter, the crystalline oxide semiconductor film is preferably free from crack(s) in a center area that is 3 mm square by an optical-microscopic surface observation. Also, the crystalline oxide semiconductor film is further preferably free from crack(s) in a center area that is 5 mm square by an optical-microscopic surface observation. Furthermore, the crystalline oxide semiconductor film is most preferably free from crack(s) in a center area that is 9.5 mm square or more by an optical-microscopic surface observation. The crystalline oxide semiconductor film may be a single crystal film or a polycrystalline film, and the crystalline oxide semiconductor film is preferably a single crystal film.

The crystalline oxide semiconductor film contains a dopant. The dopant is not particularly limited and may be a known dopant, as long as the dopant is an n-type dopant. Examples of the n-type dopant include tin (Sn), germanium (Ge), silicon (Si), titanium (Ti), zirconium (Zr), vanadium (V), niobium (Nb), and lead (Pb). According to a present inventive subject matter, the dopant is preferably tin (Sn), germanium (Ge), or silicon (Si), and the dopant is further preferably tin (Sn) or germanium (Ge). The dopant is most preferably tin (Sn). The contained amount of the dopant in a crystalline oxide semiconductor film is preferably 0.00001 atomic percent (at. %) or more in the composition of the crystalline oxide semiconductor film. The contained amount of the dopant in a crystalline oxide semiconductor film is further preferably in a range of 0.00001 at. % to 20 at. %. The range of the amount of the dopant contained in the crystalline oxide film is most preferably in a range of 0.00001 at. % to 10 at. % to enhance electrical properties of the crystalline oxide semiconductor film.

The crystalline oxide semiconductor film preferably has a rocking curve half width of 100 arcsec or more, and further preferably 300 arcsec or more as measured by X-ray diffraction. The upper limit of the half width is not particularly limited, however, is preferably 1300 arcsec, and further preferably 1100 arcsec. By setting such a preferable half width, the mobility of the obtained crystalline oxide semiconductor film can be further improved. The above-mentioned "half width" means a value obtained by measuring the rocking curve half width by XRD (X-ray diffraction: X-ray diffraction method). The measurement plane orientation is not particularly limited, however, examples of the measurement plane orientation include [11-20] and [30-30].

Hereinafter, although a preferable method of manufacturing the crystalline oxide semiconductor film is demonstrated, the present inventive subject matter is not limited to these embodiments of the method.

As a method of preferably forming the crystalline oxide semiconductor film, for example, using a mist CVD apparatus, for example, as shown in FIG. 1, the method includes turning a raw material solution containing a dopant into atomized droplets (atomization of raw material solution), carrying the atomized droplets by carrier gas into a film-formation chamber (carrying atomized droplets), forming a film by causing a thermal reaction of the atomized droplets in the film-formation chamber to form a crystalline oxide semiconductor film on a base (forming a film), and a crystalline substrate having a corundum structure and a principal plane that is an a-plane or m-plane is used. According to a present inventive subject matter, the crystalline substrate having a corundum structure and the principal plane that is an a-plane or m-plane may be a crystalline substrate having a buffer layer formed on the crystalline substrate. Furthermore, a crystalline substrate having a corundum structure and the principal plane that is an a-plane or m-plane with a non-doped buffer layer may be preferable to enhance mobility.

(Crystalline Substrate)

The crystalline substrate is not particularly limited, however, a crystalline substrate having a corundum structure partly or entirely at a principal plane that is an a-plane or an m-plane is named as a preferable example of the crystalline substrate. The crystalline substrate preferably has the corundum structure at the principal plane that is positioned at the side of crystal growth, and further preferably the crystalline substrate has the corundum structure entirely at the principal plane. Also, according to a present inventive subject matter, the crystalline substrate may include an off-angle, that is preferable to enhance electrical properties. If the principal plane of the crystalline substrate is an m-plane, the angle inclined toward an a-axis from the m-plane that is a reference plane is preferably formed. Also, the off-angle of the crystalline substrate is not particularly limited, however, is preferable 0.2° to 12.0°, further preferably 0.5° to 4.0°, and most preferably 0.5° to 3.0°. The shape of the crystalline substrate is not particularly limited, as long as the crystalline substrate has a plate-like shape and is able to support the crystalline oxide semiconductor film. The crystalline substrate may be an electrically-insulating substrate, a semiconductor substrate, and may be an electrically conductive substrate, however, the crystalline substrate is preferably an electrically-insulating substrate. Also, the crystalline substrate including a metal film arranged on a surface of the crystalline substrate is also preferable. The shape of the crystalline substrate is not particularly limited and may be a circular shape. Examples of the circular shape may include shapes of a circle, and an ellipse. The shape of the crystalline substrate may be, for example, a polygonal shape. Examples of the polygonal shape include a triangle, a square, a rectangle, a pentagon, a hexagon, a heptagon, an octagon and a nonagon. Various shapes of crystalline substrates may be available. According to a present inventive subject matter, the shape of the crystalline substrate would be selectable to form a semiconductor film in a desired shape on the crystalline substrate with the shape. Also, according to a present inventive subject matter, the crystalline substrate may have a larger area to form a crystalline oxide film that has a larger area on the crystalline substrate. The substrate material of the crystalline substrate is not particularly limited, as long as an object of the present inventive subject matter is not interfered with, and a known substrate material may be used. Examples of the substrate material with a corundum structure include $\alpha$-$Al_2O_3$ (sapphire substrate) and $\alpha$-$Ga_2O_3$. Preferable examples of the substrate material include a sapphire substrate with a principal plane that is an a-plane, a sapphire substrate with a principal plane that is an m-plane, a sapphire substrate with a principal plane that is an a-plane, an $\alpha$-$Ga_2O_3$ (with a principal plane that is an a-plane or an m-plane).

Examples of the buffer layer without containing a dopant include $\alpha$-$Fe_2O_3$, $\alpha$-$Ga_2O_3$, $\alpha$-$Al_2O_3$, and a mixed crystal thereof. According to a present inventive subject matter, the buffer layer is preferably $\alpha$-$Ga_2O_3$. A method of forming the buffer layer on the crystalline substrate is not particularly limited, and may be a known method, and also, a similar method of forming a film as the method of forming the crystalline oxide semiconductor film may be used.

(Forming Atomized Droplets)

Forming atomized droplets, the raw material solution is turned into atomized droplets. A method of forming atomized droplets from the raw material solution is not particularly limited, as long as the raw material solution is able to be turned into atomized droplets, and a known method may be used, however, according to a present inventive subject matter, a method of forming atomized droplets using ultrasonic vibration is preferable. Atomized droplets including mist particles and obtained by using ultrasonic vibration and floating in the space have the initial velocity that is zero.

Since atomized droplets floating in the space is carriable as a gas, the atomized droplets floating in the space are preferable to avoid damage caused by the collision energy without being blown like a spray. The size of droplets is not limited to a particular size, and may be a few mm, however, the size of atomized droplets is preferably 50 µm or less. The size of droplets is further preferably in a range of 0.1 to 10 µm.

(Raw-Material Solution)

The raw-material solution is not particularly limited as long as a semiconductor film is formed from the raw-material solution by a mist CVD method and contains the dopant. Examples of the raw-material solution include a solution of organometallic complex of a metal, and a solution of halide. Example of organometallic complex for the solution includes a solution of acetylacetonate complex. Examples of halide for the solution includes a solution of fluoride, a solution of chloride, a solution of bromide and a solution of iodide. Examples of the metal of organometallic complex include gallium, indium, and/or aluminum. According to an embodiment of a present inventive subject matter, the metal of organometallic complex preferably contains at least gallium. The amount of metal contained in the raw material solution is not particularly limited as long as an object of the present inventive subject matter is not interfered with, however, the amount of metal(s) contained in the raw material solution is preferably 0.001 mol % to 50 mol %. The amount of metal contained in the raw material solution is further preferably 0.01 mol % to 50 mol %.

Also, according to a present inventive subject matter, the raw material solution contains a dopant. By introducing a dopant into a raw material solution, it is possible to control electrical conductivity of a crystalline oxide semiconductor film while being formed, without ion implantation, for example, and thus, without breaking the crystalline structure of the crystalline oxide semiconductor film. The dopant may be an n-type dopant such as tin, germanium, silicon and lead, if the metal(s) contain at least gallium. The n-type dopant is preferably tin or germanium, and most preferably tin. The dopant concentration in general may be in a range of $1 \times 10^{16}/cm^3$ to $1 \times 10^{22}/cm^3$. The dopant concentration may be at a lower concentration of, for example, approximately $1 \times 10^{17}/cm^3$ or less, and also the dopant concentration may be at a high concentration of, for example, $1 \times 10^{20}/cm^3$ or more. According to embodiments of a present inventive subject matter, the dopant concentration is preferably $1 \times 10^{20}/cm^3$ or less, and further preferably $5 \times 10^{19}/cm^3$ or less.

A solvent of the raw material solution is not particularly limited and may be an inorganic solvent such as water or an organic solvent such as alcohol. Furthermore, according to an embodiment of a present inventive subject matter, a mixed solvent of water and alcohol may be used. According to embodiments of a present inventive subject matter, a solvent of the raw material solution preferably contains water, and a mixed solvent of water and alcohol is further preferably used, and most preferably, a solvent of the raw material solution is water, which may include, for example, pure water, ultrapure water, tap water, well water, mineral water, hot spring water, spring water, fresh water and ocean water. According to embodiments of a present inventive subject matter, ultrapure water is preferable as a solvent of a raw material solution.

(Carrying Atomized Droplets)

The atomized droplets are carried into a film-formation chamber by carrier gas. The carrier gas is not limited as long as an object of the present inventive subject matter is not interfered with, and thus, examples of the carrier gas may be oxygen, ozone, an inert gas such as nitrogen and argon, or a reducing gas such as a hydrogen gas and a forming gas. The type of carrier gas may be one or more, and a dilution gas at a reduced flow rate (e.g., 10-fold dilution gas) and the like may be used further as a second carrier gas. The carrier gas may be supplied from one or more locations. While the flow rate of the carrier gas is not particularly limited, the flow rate of the carrier gas may be in a range of 0.01 to 20 L/min. According to an embodiment of a present inventive subject matter, the flow rate of the carrier gas may be preferably in a range of 0.5 to 10 L/min. When a dilution gas is used, the flow rate of the dilution gas is preferably in a range of 0.001 to 2 L/min, and further preferably in a range of 0.1 to 1 L/min.

(Film Formation)

In the film-formation, an oxide semiconductor film is formed on the base by thermal reaction of the atomized droplets in the film-formation. Thermal reaction is not particularly limited if the atomized droplets react on heating, and reaction conditions are not particularly limited if an object of the present invention is not interfered with. In the film-formation, the thermal reaction is conducted at an evaporation temperature or higher temperature of the evaporation temperature of the solvent of the raw material solution. During the thermal reaction, the temperature should not too high (for example not higher than 1000° C.). For example, the temperature during the thermal reaction is preferably 650° C. or less. The temperature during the thermal reaction is most preferably in a range of 400° C. to 650° C. The thermal reaction may be conducted in any atmosphere of a vacuum, a non-oxygen atmosphere, a reducing-gas atmosphere, and an atmosphere of oxygen. Also, the thermal reaction may be conducted in any condition of under an atmospheric pressure, under an increased pressure, and under a reduced pressure. According to a present inventive subject matter, the thermal reaction is preferably conducted under an atmospheric pressure. Also, a film thickness of the oxide semiconductor film is able to be set by adjusting a film formation time.

The crystalline oxide semiconductor film obtained as mentioned above not only having enhanced electrical properties especially in mobility but also with reduction of crack is industrially useful. Such crystalline oxide semiconductor films are able to be preferably used for semiconductor devices, especially for power devices, and the crystalline oxide semiconductor film is, for example, used for an n-type semiconductor layer (which may include an n$^+$-type semiconductor layer and an n$^-$-type semiconductor layer) of the semiconductor device. Also, in a present inventive subject matter, the crystalline oxide semiconductor film may be used as it is, and also, the crystalline oxide separated from the substrate etc. by a known method may be used in semiconductor devices.

Semiconductor devices may be categorized as planar semiconductor devices and also as vertical semiconductor devices. According to a present inventive subject matter, embodiments are suitably used for both planar semiconductor devices and vertical semiconductor devices, and preferably used for vertical semiconductor devices. Examples of the semiconductor device include a Schottky barrier diode (SBD), a metal semiconductor field-effect transistor (MESFET), a high-electron-mobility transistors (HEMT), a metal-oxide-semiconductor field-effect transistor (MOSFET), a static induction transistor (SIT), a junction field-effect transistor (JFET), an insulated gate bipolar transistor (IGBT), and a light emitting diode (LED).

Hereinafter, examples in which a crystalline oxide semiconductor film is used as an n-type semiconductor layer (that may be an n+-type semiconductor layer or an n−-type semiconductor layer) are explained with figures, however, the present inventive subject matter is not limited thereto. Also, the following semiconductor devices shown as examples may include other layer(s) such as an electrically-insulating layer, a semi-insulating layer, an electrically-conductive layer, a semiconductor layer, a buffer layer or another medium layer. Also, it is possible to omit a buffer layer suitably.

Figure 2:
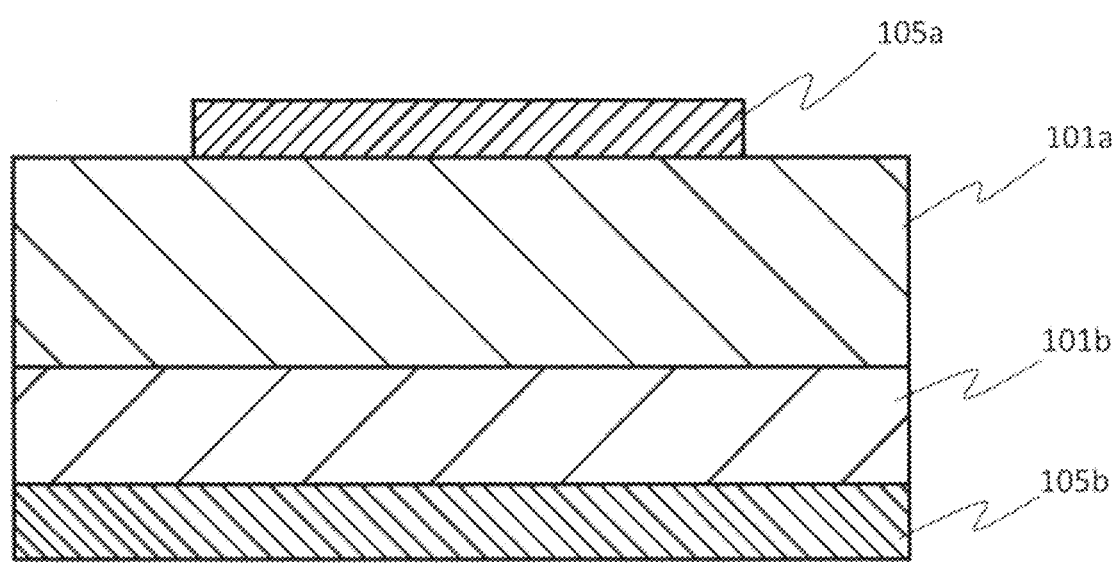
FIG. 2 shows a schematic view of a Schottky barrier diode (SBD) as an embodiment.

FIG. 2 shows a schematic view of an embodiment of a Schottky barrier diode (SBD) according to the present inventive subject matter. The SBD in FIG. 2 includes an n−-type semiconductor layer 101a, an n+-type semiconductor layer 101b, a Schottky electrode 105a and an Ohmic electrode 105b.

The material of the Schottky electrode and the ohmic electrode may be a known material. Examples of the electrode material include Al, Mo, Co, Zr, Sn, Nb, Fe, Cr, Ta, Ti, Au, Pt, V, Mn, Ni, Cu, Hf, W, Ir, Zn, Pd, Nd, Ag and/or alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials.

The formation of the Schottky electrode and the ohmic electrode can be performed by, for example, a known method such as a vacuum evaporation method or a sputtering method. For more details, if a Schottky electrode is formed by using two metals including a first metal and a second metal, a layer of the first metal may be arranged on a layer of the second metal and a patterning may be made on the layers of the first metal and the second metal by use of a photolithography method.

When a reverse bias is applied to the SBD shown in FIG. 2, a depletion layer (not shown) spreads in the n−-type semiconductor layer 101a resulting in the SBD to have a high breakdown voltage. In addition, when a forward bias is applied to the SBD, electrons flow from the ohmic electrode 105b to the Schottky electrode 105a. Thus, the SBD using the semiconductor structure is excellent for high withstand voltage and high current, has a high switching speed, and is excellent in withstand voltage and reliability.

(HEMT)

Figure 3:
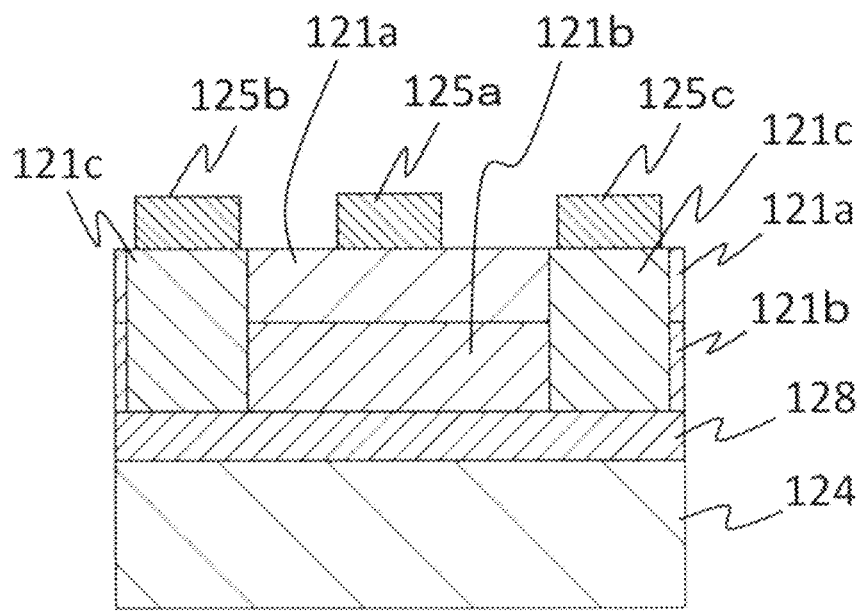
FIG. 3 shows a schematic view of a high electron mobility transistor (HEMT) as an embodiment.

FIG. 3 shows a schematic view of an embodiment of a high-electron-mobility transistor (HEMT) according to the present inventive subject matter including an n-type semiconductor layer with wide band gap 121a, an n-type semiconductor layer with narrow band gap 121b, an n+-type semiconductor layer 121c, a semi-insulating layer 124, a buffer layer 128, a gate electrode 125a, a source electrode 125b, and a drain electrode 125c.

(MOSFET)

Figure 4:
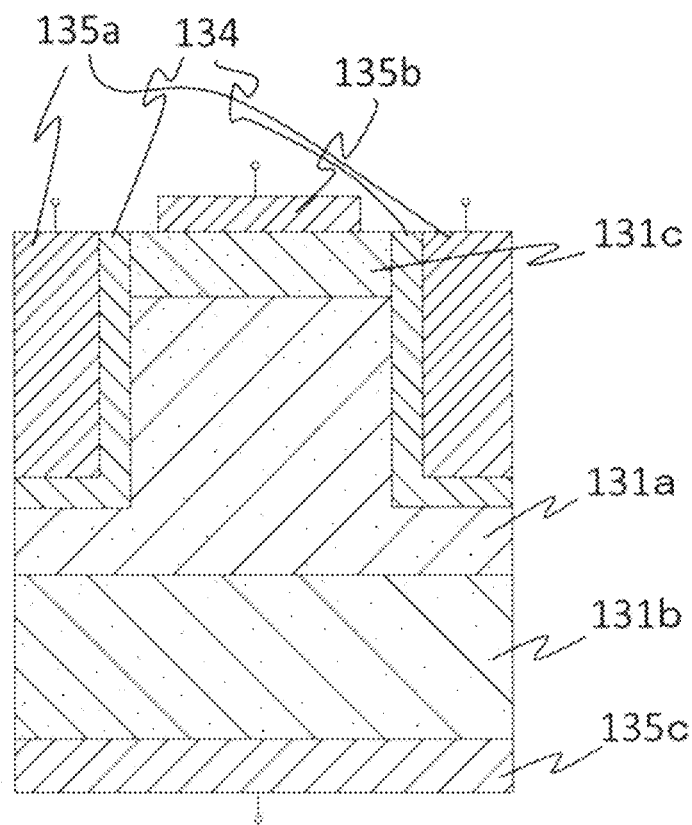
FIG. 4 shows a schematic view of a metal oxide semiconductor field effect transistor (MOSFET) as an embodiment.

FIG. 4 shows a schematic view of an embodiment of a metal oxide semiconductor field-effect transistors (MOSFET) according to the present inventive subject matter. The MOSFET includes an n−-type semiconductor layer 131a, a first n+-type semiconductor layer 131b, a second n+-type semiconductor layer 131c, a gate insulating layer 134, a gate electrode 135a, a source electrode 135b and a drain electrode 135c.

(JFET)

Figure 5:
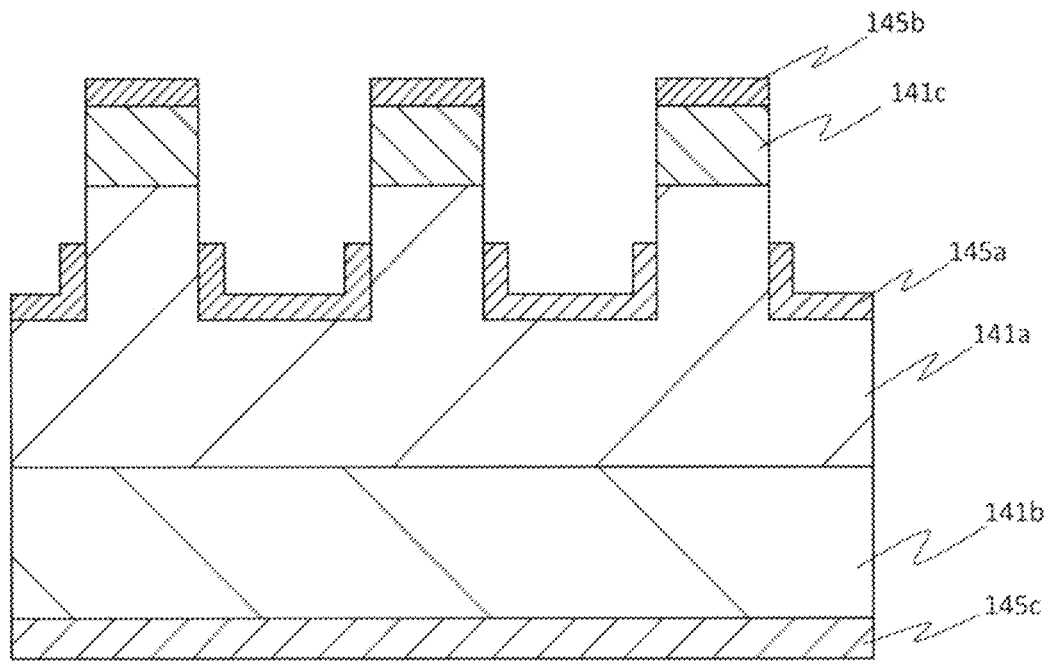
FIG. 5 shows a schematic view of a junction field effect transistor (JFET) as an embodiment.

FIG. 5 shows a schematic view of an embodiment of a junction field-effect transistors (JFET) according to the present inventive subject matter including an n−-type semiconductor layer 141a, a first n+-type semiconductor layer 141b, a second n+-type semiconductor layer 141c, a gate electrode 145a, a source electrode 145b and a drain electrode 145c.

Figure 6:
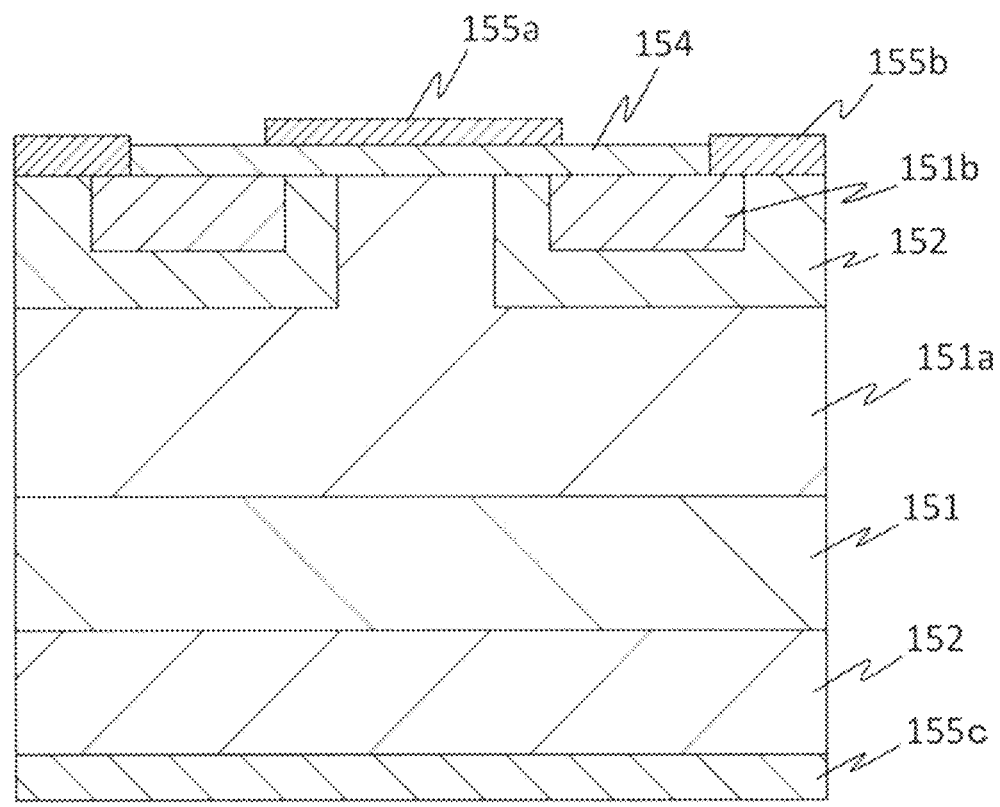
FIG. 6 shows a schematic view of an insulated gate bipolar transistor (IGBT) as an embodiment.

(IGBT) FIG. 6 shows a schematic view of an embodiment of an insulated gate bipolar transistor (IGBT) according to the present inventive subject matter including an n-type semiconductor layer 151, an n+-type semiconductor layer 151a, an n+-type semiconductor layer 151b, a p-type semiconductor layer 152, a gate insulating layer 154, a gate electrode 155a, an emitter electrode 155b and a collector electrode 155c.

Figure 7:
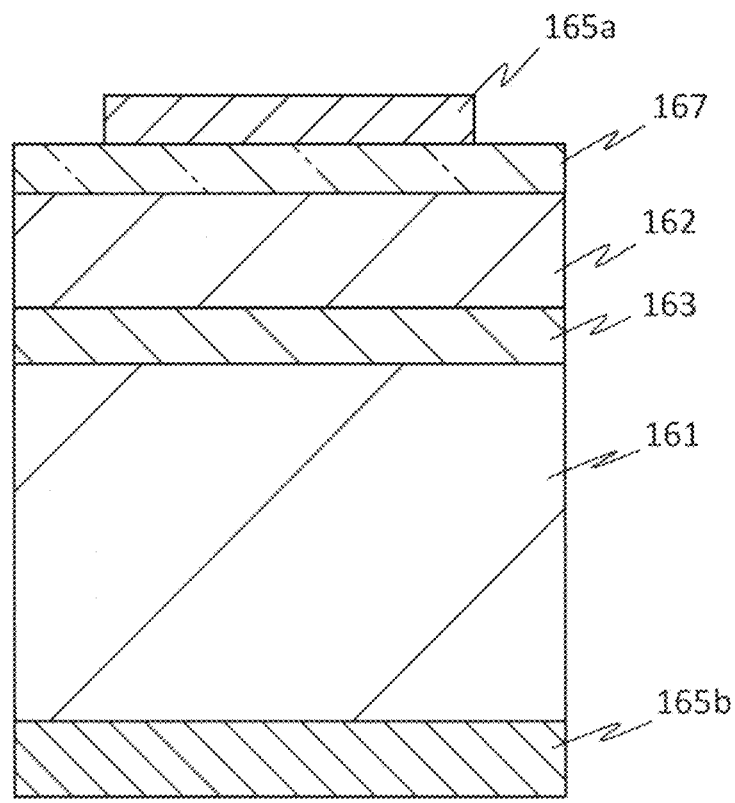
FIG. 7 shows a schematic view of a light emitting diode (LED) as an embodiment.

(LED) FIG. 7 shows a schematic view of an embodiment of a light emitting diode (LED) according to the present inventive subject matter. The LED shown in FIG. 7 includes an n-type semiconductor layer 161 on a second electrode 165b, and a light emitting layer 163 is positioned on the n-type semiconductor layer 161. Also, a p-type semiconductor layer 162 is positioned on the light emitting layer 163. A light-transmitting electrode 167, that permeates the light generated in the light emitting layer 163, is provided on the p-type semiconductor layer 162. A first electrode is positioned on the light-transmitting electrode 167. A light emitting material used for the light emitting layer may be a known material. The light emitting device shown in FIG. 7 may be covered with a protective layer except for the electrode portion.

Examples of the material of the light-transmitting electrode may include oxide conductive material containing indium or titanium. Regarding the material of the light-transmitting electrode, in detail, the material may be $In_2O_3$, ZnO, $SnO_2$, $Ga_2O_3$, $TiO_2$, a mixed crystal thereof. The material may contain a dopant. By providing those materials using known method such as sputtering, the translucent electrode would be formed. Also, annealing may be carried out after forming the light-transmitting electrode, in order to make the electrode more transparent.

According to the light emitting diode of FIG. 7, the light-emitting layer 163 is configured to emit light by applying a current to the p-type semiconductor layer 162, the light emitting layer 163, and the n-type semiconductor layer 161, through the first electrode 165a as a positive electrode and a second electrode 165b as a negative electrode.

Examples of the material of the first electrode 165a and the second electrode 165b may include Al, Mo, Co, Zr, Sn, Nb, Fe, Cr, Ta, Ti, Au, Pt, V, Mn, Ni, Cu, Hf, W, Ir, Zn, Pd, Nd, Ag and/or alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. A forming method of the first and the second electrode is not particularly limited. Examples of the forming method of the first and the second electrode may include wet methods such as printing method, spray method, coating method, physical methods such as vacuum deposition method, sputtering method, ion plating method, chemical methods such as CVD method, plasma CVD method. The forming method may be selected from above mentioned methods in consideration of a suitability for the material of the first electrode and the second electrode.

Figure 8:
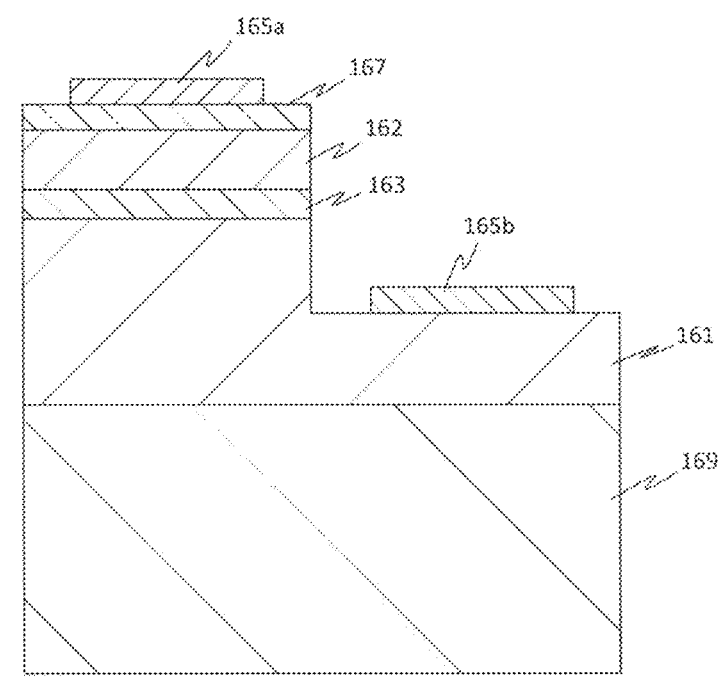
FIG. 8 shows a schematic view of a light emitting diode (LED) as an embodiment.

Also, FIG. 8 shows another aspect of a light-emitting diode. In the light-emitting diode shown in FIG. 8, an n-type semiconductor layer 161 is arranged on a substrate 169, and a p-type semiconductor layer 162, a light-emitting layer 163 and an n-type semiconductor layer 161 are partly removed to expose the n-type semiconductor layer 161, and a second electrode 165b is arranged on a part of the exposed semiconductor layer 161.

Figure 9:
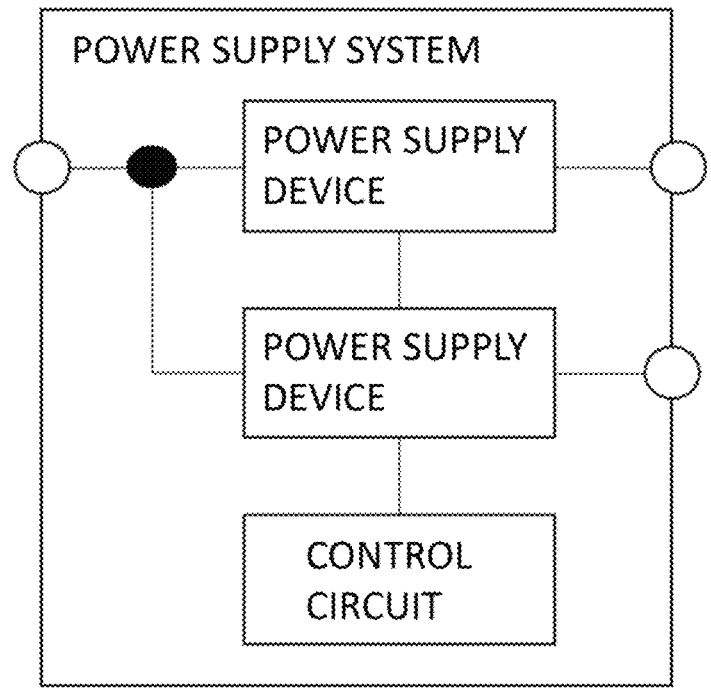
FIG. 9 shows a schematic view of a power supply system as an embodiment.
Figure 10:
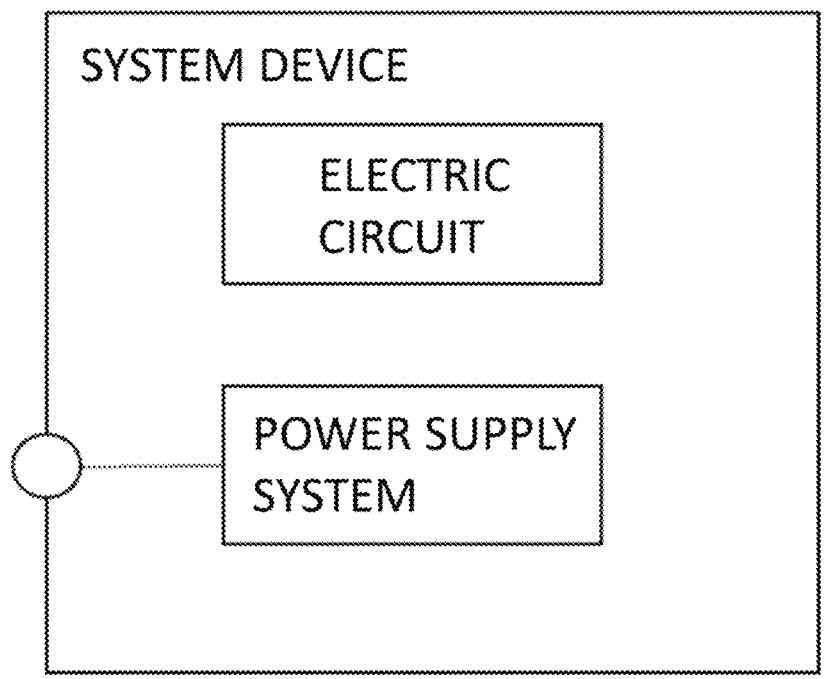
FIG. 10 shows a schematic view of a system device as an embodiment.
Figure 11:
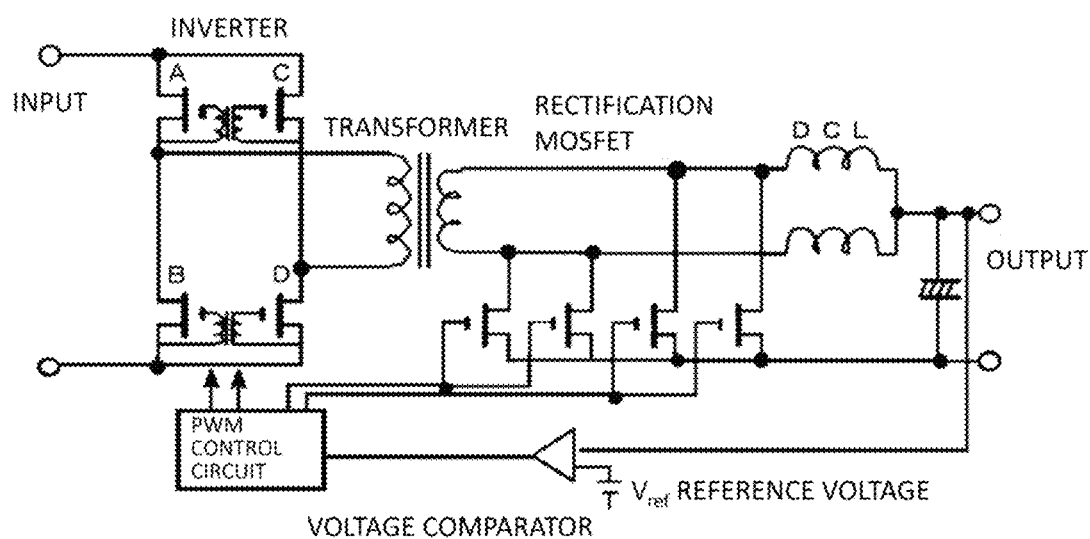
FIG. 11 shows a schematic view of a circuit diagram of a power supply device as an embodiment.

The semiconductor device is used for a system using a power source device. The power source device is able to be obtained by connecting the semiconductor device to a wiring pattern by use of a known method. FIG. 9 shows an example of a power source system. FIG. 9 shows a schematic view of the power source system using two or more power source devices and a circuit diagram. The power source system is, as shown in FIG. 10, used for a system device in combination with a control circuit. Also, FIG. 11 shows an example of a power supply circuit of a power supply device, including a power circuit and a control circuit. A DC voltage is switched at high frequencies by an inverter (configured with MOSFET A to D) to be converted to AC, followed by insulation and transformation by a transformer 193. The voltage is then rectified by rectification MOSFETs and then smoothed by a DCL (smoothing coils) and a capacitor to output a direct current voltage. At this point, the output voltage is compared with a reference voltage by a voltage comparator to control the inverter and the rectification MOSFETs by a PWM control circuit to have a desired output voltage.

Some practical examples according to a present inventive subject matter are explained as follows, but the present inventive subject matter is not particularly limited thereto.

Example 1

1. Film-Formation Apparatus

FIG. 1 shows a mist CVD apparatus used in the Examples. The mist CVD apparatus 19 may include a susceptor 21 on which a substrate 20 is placed. The mist CVD apparatus 19 includes a carrier gas supply device 22a, a first flow-control valve 23a to control a flow of a carrier gas that is configured to be sent from the carrier gas supply device 22a, a diluted carrier gas supply device 22b, a second flow-control valve 23b to control a flow of a carrier gas that is configured to be sent from the diluted carrier gas supply device 22b, a mist generator 24 in that a raw material solution 24a is contained, a container 25 in that water 25a is contained, an ultrasonic transducer that may be attached to a bottom surface of the container 25, a supply pipe 27 that may be a quartz pipe with an inside diameter that may be 40 mm, and a heater 28 arranged at a peripheral portion of the supply pipe. The susceptor 21 includes a surface that is slanted off the horizontal and on that the substrate 20 is arranged. The susceptor 21 is made of quartz. Since the susceptor 21 and the supply pipe 27 that are configured to be a film-formation chamber are made of quartz, this configuration reduces a possibility that a foreign substance entering a film that is formed on the substrate 20.

2. Preparation of a Raw-Material Solution

Gallium acetylacetonate and tin (II) chloride are mixed in ultrapure water to be a raw material solution 24a such that the atomic ratio of gallium to tin is 1:0.002 and gallium is 0.005 mol/L, and the raw material solution 24a contains hydrochloric acid to be 1.5% by volume ratio.

3. Preparation of Film-Formation

The raw-material solution 24a obtained at 2. the Preparation of the Raw-Material Solution above was set in the mist generator 24. Then, an m-plane sapphire substrate as a base 20 was placed on the susceptor 21, and the heater 28 was activated to raise the temperature in the film-formation chamber 27 up to 460° C. The first flow-control valve 23a and the second flow-control valve 23b were opened to supply a carrier gas from the carrier gas source 22a and the diluted carrier gas source 22b, which are the source of carrier gas, into the film-formation chamber 27 to replace the atmosphere in the film-formation chamber 27 with the carrier gas sufficiently. After the atmosphere in the film-formation chamber 27 was sufficiently replaced with the carrier gas, the flow rate of the carrier gas from the carrier gas source 22a was regulated at 1.0 L/min. and the diluted carrier gas from the diluted carrier gas source 22b was regulated at 0.5 L/min. Also, nitrogen was used as the carrier gas.

4. Formation of Semiconductor Film

Next, the ultrasonic transducer 26 was then vibrated at 2.4 MHz, and the vibrations were propagated through the water 25a to the raw material solution 24a to generate atomized droplets from the raw material solution 2. The atomized droplets were introduced in the film-formation chamber 27 with the carrier gas. In the film-formation chamber 27, the atomized droplets were reacted at 460° C. under atmospheric pressure in the supply pipe 27 to form a semiconductor film on the base 20. The film was 2.5 μm in film thickness. The film-formation time was 360 minutes.

Example 2 to Example 4

Crystalline oxide semiconductor films were obtained by the same conditions as the conditions of the Example 1 except the following condition: using an m-plane sapphire substrate with an off-angle as the base. In the Example 2, the off-angle was 0.5°. In the Example 3, the off-angle was 2.0°. In the Example 3, the off-angle was 2.0°. In the Example 4, the off-angle was 3.0°. The crystalline oxide semiconductor film in the Example 2 was 3.0 μm in film thickness. The crystalline oxide semiconductor film in the Example 3 was 2.9 μm in film thickness. The crystalline oxide semiconductor film in the Example 4 was 3.3 μm in film thickness.

Example 5

To confirm reproducibility, a crystalline oxide semiconductor film was obtained by the same conditions as the conditions of the Example 4, and the crystalline oxide semiconductor film obtained herein was 3.4 μm in film thickness. Also, to confirm reproductivity, following Test Examples were conducted, and as clearly shown in Table 1, reproducibility was confirmed to be favorable. Also, the film thickness of the obtained crystalline oxide semiconductor films indicates favorable reproductivity.

Example 6

A crystalline oxide semiconductor film was obtained by the same conditions as the conditions of the Example 1 except the following conditions that gallium bromide and tin bromide are mixed in ultrapure water to be a raw material solution 24a such that the atomic ratio of gallium to tin is 1:0.08 and gallium is 0.1 mol/L in aqueous solution which contains hydrobromic acid that is to be 10% by volume ratio, an a-plane sapphire substrate without a buffer layer on a surface of the a-plane sapphire substrate was used as a base instead of using an m-plane sapphire substrate on that α-Ga$_2$O$_3$ film (non-doped) was arranged as a buffer layer, and the film-formation time was set to be ten minutes.

Example 7

A crystalline oxide semiconductor film was obtained by the same conditions as the conditions of the Example 6 except the following condition that α-Ga$_2$O$_3$ film (non-doped) arranged as a buffer layer on an a-plane sapphire substrate was used as the substrate instead of an a-plane sapphire substrate being used. The crystalline oxide semiconductor film that was obtained was 0.3 μm in film thickness.

Example 8

To confirm reproducibility, a crystalline oxide semiconductor film was obtained by the same conditions as the conditions of the Example 7, and the crystalline oxide semiconductor film obtained herein was 0.3 μm in film thickness. Also, to confirm reproductivity, following Test Examples were conducted, and as clearly shown in Table 1, reproducibility was confirmed to be favorable. Also, the film thickness of the obtained crystalline oxide semiconductor films indicates favorable reproductivity.

Example 9

A crystalline oxide semiconductor film was obtained by the same conditions as the conditions of the Example 1 except the following conditions that α-Ga$_2$O$_3$ film (Sn-doped) arranged as a buffer layer on a surface of an a-plane sapphire substrate was used as the substrate instead of α-Ga$_2$O$_3$ film (non-doped) arranged as a buffer layer on a surface of an m-plane sapphire substrate being used, and the film-formation time was set to be 180 minutes.

Example 10

A crystalline oxide semiconductor film was obtained by the same conditions as the conditions of the Example 9 except the following conditions that α-Ga$_2$O$_3$ film (non-doped) arranged as a buffer layer on an a-plane sapphire substrate was used as the substrate, and a raw material solution was prepared such that the atomic ratio of gallium to tin is to be 1:0.0002. The crystalline oxide semiconductor film was 1.0 μm in film thickness.

Example 11

A crystalline oxide semiconductor film was obtained by the same conditions as the conditions of the Example 9 except the following conditions that an a-plane sapphire substrate without a buffer layer arranged on the a-plane sapphire substrate was used instead of an α-Ga$_2$O$_3$ film (Sn-doped) arranged as a buffer layer on an a-plane sapphire substrate being used. The crystalline oxide semiconductor film obtained herein was 0.9 μm in film thickness.

Example 12

A crystalline oxide semiconductor film was obtained by the same conditions as the conditions of the Example 6 except the following conditions that a raw material solution was prepared such that the atomic ratio of germanium to gallium is to be 1:0.01, gallium is to be 0.1 mol/L in aqueous solution which contains hydrobromic acid that is to be 20% by volume ratio, and the film-formation time was set to be 30 minutes.

Example 13

A crystalline oxide semiconductor film was obtained by the same conditions as the conditions of the Example 3 except the following condition that the film-formation time was set to be 720 minutes. The crystalline oxide semiconductor film was 3.8 μm in film thickness.

Comparative Example 1

A crystalline oxide semiconductor film was obtained by the same conditions as the conditions of the Example 1 except the following condition that a c-plane sapphire substrate without a buffer layer arranged on the c-plane sapphire substrate was used instead of an α-Ga$_2$O$_3$ film (non-doped) arranged as a buffer layer on an m-plane sapphire substrate being used.

Comparative Example 2

A crystalline oxide semiconductor film was obtained by the same conditions as the conditions of the Example 6 except the following conditions that gallium bromide and germanium oxide are mixed in ultrapure water to be a raw material solution such that the atomic ratio of gallium to germanium is to be 1:0.005, and a c-plane sapphire substrate without a buffer layer on a surface of the c-plane sapphire substrate was used as a base instead of an a-plane sapphire substrate without a buffer layer on a surface of the a-plane sapphire substrate being used.

Comparative Example 3

A crystalline oxide semiconductor film was obtained by the same conditions as the conditions of the Example 6 except the following conditions that a raw material solution is adjusted such that the atomic ratio of gallium to tin is to be 1:0.005, and a c-plane sapphire substrate without a buffer layer on a surface of the c-plane sapphire substrate was used as a base instead of an a-plane sapphire substrate without a buffer layer on a surface of the a-plane sapphire substrate being used.

Test Example 1

Using an X-ray diffraction (XRD) device, phases of the crystalline oxide semiconductor films obtained in Examples 1 to 13 and in Comparative Examples 1 to 3 were identified by conducting 2Θ/ω-scan at angles from 15° to 95°. The measurement was conducted by use of CuKα radiation. As the result, all of the crystalline oxide semiconductor films obtained in Examples 1 to 5 and in Example 13 were m-plane α-Ga$_2$O$_3$ films. Also, all of the crystalline oxide semiconductor films obtained in Examples 6 to 12 were a-plane α-Ga$_2$O$_3$ films, and all of the crystalline oxide semiconductor films obtained in Comparative Examples 1 to 3 were c-plane α-Ga$_2$O$_3$ films. Also, a full width of half maximum (FWHM) of rocking curve of each of crystalline oxide semiconductor films obtained in Examples 1, 2, 4, 7 to 12 and in Comparative Example 1 was measured, and the measurement results were shown in Tables 1 to 3.

Test Example 2

Hall effect measurement was conducted by van der pauw method on the crystalline oxide films obtained in Examples 1 to 13 and in Comparative Examples 1 to 3. Carrier concentration, mobility and resistivity of the crystalline oxide semiconductor films are indicated I Tables 1 to 3. As shown in the Tables 1 to 3, the crystalline oxide semiconductor films of the present inventive subject matter are enhanced in electric properties, especially in mobility.

Text Example 3

Film surfaces of the crystalline oxide semiconductor films obtained in Examples 1 to 13 and in Comparative Examples 1 to 3 were observed by use of an optical microscope. Observation results are shown in Tables 1 to 3, and in the observation, a crystalline oxide semiconductor film without crack(s) in 3 mm square at the center of the crystalline oxide semiconductor film is indicated as ◯, and a crystalline oxide semiconductor film with crack(s) in 3 mm square at the center of the crystalline oxide semiconductor film is indicated as x. As shown in Tables 1 to 3, the crystalline oxide semiconductor films of the present inventive subject matter, it is clear that cracks were decreased.

TABLE 1

|  | Example 1 | Example 2 | Example 3 | Example 4 | Example 5 | Example 6 | Example 7 | Example 8 |
|---|---|---|---|---|---|---|---|---|
| Carrier concentration ($cm^{-3}$) | 2.89E+19 | 2.84E+19 | 1.31E+19 | 3.13E+19 | 3.13E+19 | 1.95E+19 | 2.91E+19 | 2.01E+19 |
| Hall mobility ($cm^2/Vs$) | 42.70 | 55.83 | 50.22 | 55.35 | 51.77 | 55.82 | 55.61 | 50.73 |
| Resistivity (m$\Omega$ cm) | 5.06 | 3.94 | 9.50 | 3.61 | 3.86 | 5.74 | 3.86 | 6.13 |
| A full width at half maximum of rocking curve (arcsec) | 688 | 932 | — | 925 | — | — | 814 | 1026 |
| With (X)/without (◯) crack(s) in 3 mm square at the center | ◯ | ◯ | ◯ | ◯ | ◯ | ◯ | ◯ | ◯ |

TABLE 2

|  | Example 9 | Example 10 | Example 11 | Example 12 | Example 13 |
|---|---|---|---|---|---|
| Carrier concentration ($cm^{-3}$) | 1.75E+19 | 1.86E+18 | 2.25E+19 | 1.35E+19 | 1.87E+19 |
| Hall mobility ($cm^2/Vs$) | 48.08 | 45.57 | 31.58 | 35.47 | 93.90 |
| Resistivity (m$\Omega$ cm) | 7.43 | 73.74 | 8.80 | 13.05 | 3.56 |
| A full width at half maximum of rocking curve (arcsec) | 875 | 814 | 1174 | 392 | — |
| With (X)/without (◯) crack(s) in 3 mm square at the center | ◯ | ◯ | ◯ | ◯ | ◯ |

TABLE 3

|  | Comparative Example 1 | Comparative Example 2 | Comparative Example 3 |
|---|---|---|---|
| Carrier concentration ($cm^{-3}$) | 2.7E+19 | 6.38E+18 | 2.42E+19 |
| Hall mobility ($cm^2/Vs$) | 2.80 | 5.53 | 3.23 |
| Resistivity (m$\Omega$ cm) | 82.67 | 177.15 | 79.96 |
| A full width at half maximum of rocking curve (arcsec) | 40.00 | — | — |
| With (X)/without (◯) crack(s) in 3 mm square at the center | X | X | X |

Example 14

A crystalline oxide semiconductor film was obtained by the same conditions as the conditions of the Example 6 except the following condition that silicon bromide was used as a dopant material. As the result, the crystalline oxide semiconductor film was found to have performance equivalent to that of the crystalline oxide semiconductor film in the Example 1 exhibited.

Example 15

A crystalline oxide semiconductor film was obtained by the same conditions as the conditions of the Example 1. The crystalline oxide semiconductor film obtained herein was 2.3 μm in film thickness.

Example 16

A crystalline oxide semiconductor film was obtained by the same conditions as the conditions of the Example 1 except the following condition that an m-plane sapphire substrate with an off-angle of 2° to an a-axis. The crystalline oxide semiconductor film obtained herein was 3.2 μm in film thickness.

Example 17

A crystalline oxide semiconductor film was obtained by the same conditions as the conditions of the Example 16. The crystalline oxide semiconductor film obtained herein was 2.2 μm in film thickness.

Example 18

A crystalline oxide semiconductor film was obtained by the same conditions as the conditions of the Example 1 except the following condition that an m-plane sapphire substrate with an off-angle of 2° to an a-axis and without an α-$Ga_2O_3$ film (non-doped) as a buffer layer layered on a surface of the m-plane sapphire substrate was used as a base. The crystalline oxide semiconductor film obtained herein was 2 μm in film thickness.

Example 19

A crystalline oxide semiconductor film was obtained by the same conditions as the conditions of the Example 1 except the following condition that an m-plane sapphire substrate with an off-angle of 4° to an a-axis was used as a base. The crystalline oxide semiconductor film obtained herein was 2.6 μm in film thickness.

Example 20

A crystalline oxide semiconductor film was obtained by the same conditions as the conditions of the Example 18 except the following condition that Gallium acetylacetonate and tin (II) chloride are mixed in ultrapure water to be a raw material solution such that the atomic ratio of gallium to tin is 1:0.0002 and gallium is 0.05 mol/L. The crystalline oxide semiconductor film obtained herein was 1.8 μm in film thickness.

Example 21

A crystalline oxide semiconductor film was obtained by the same conditions as the conditions of the Example 18 except the following condition that Gallium acetylacetonate and tin (II) chloride are mixed in ultrapure water to be a raw material solution such that the atomic ratio of gallium to tin is 1:0.0002 and gallium is 0.05 mol/L. The crystalline oxide semiconductor film obtained herein was 1.8 μm in film thickness.

Text Example 4

Figure 12:
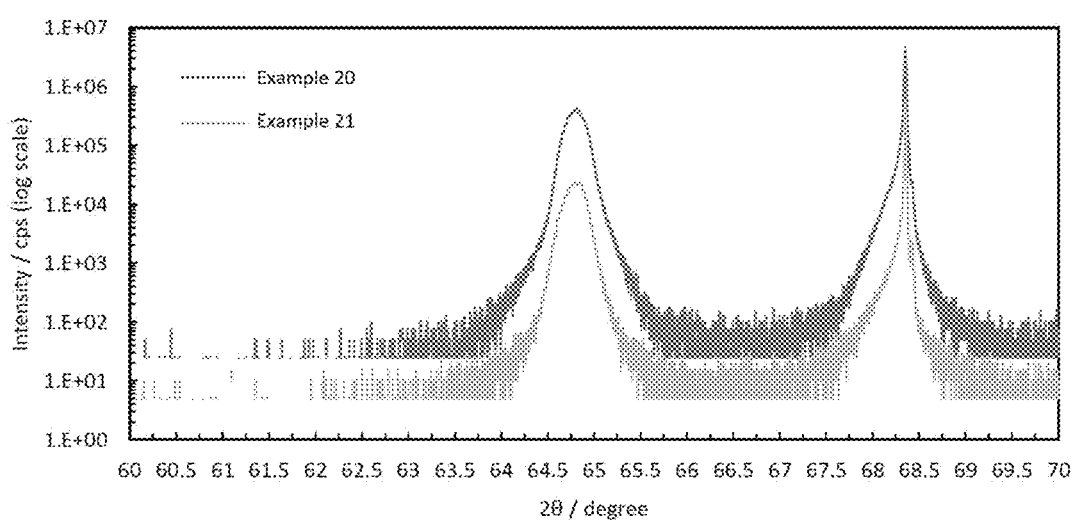
FIG. 12 shows an XRD measurement result of an Example.

The crystalline oxide semiconductor films obtained in Examples 15 to 21 were identified under the same conditions as the conditions in the Test Example 1. As the result, all of the crystalline oxide semiconductor films obtained in Examples 15 to 21 were m-plane α-$Ga_2O_3$ films. Also, XRD measurement results of the crystalline oxide semiconductor film obtained in the Example 20 and the crystalline oxide semiconductor film obtained in the Example 21 were shown in FIG. 12. Also, carrier concentration, mobility and a full width of half maximum (FWHM) of rocking curve of each of crystalline oxide semiconductor films obtained in the Examples 15 to 21 were measured, and the measurement results were shown in Table 4.

TABLE 4

|  | Example 15 | Example 16 | Example 17 | Example 18 | Example 19 | Example 20 | Example 21 |
| --- | --- | --- | --- | --- | --- | --- | --- |
| Carrier concentration ($cm^{-3}$) | 1.84E+19 | 1.87E+19 | 1.76E+19 | 1.60E+19 | 2.11E+19 | 1.75E+18 | 1.76E+18 |
| Hall mobility ($cm^2$/Vs) | 86.43 | 93.91 | 106.90 | 112.58 | 30.17 | 40.03 | 47.57 |
| A full width at half maximum of rocking curve (arcsec) | 1004.4 | 878.4 | 993.6 | 1731.6 | 997.2 | 1569.6 | 1011.6 |
| With (X)/without (○) crack(s) in 3 mm square at the center | ○ | ○ | ○ | ○ | ○ | ○ | ○ |

Test Example 5

Figure 13:
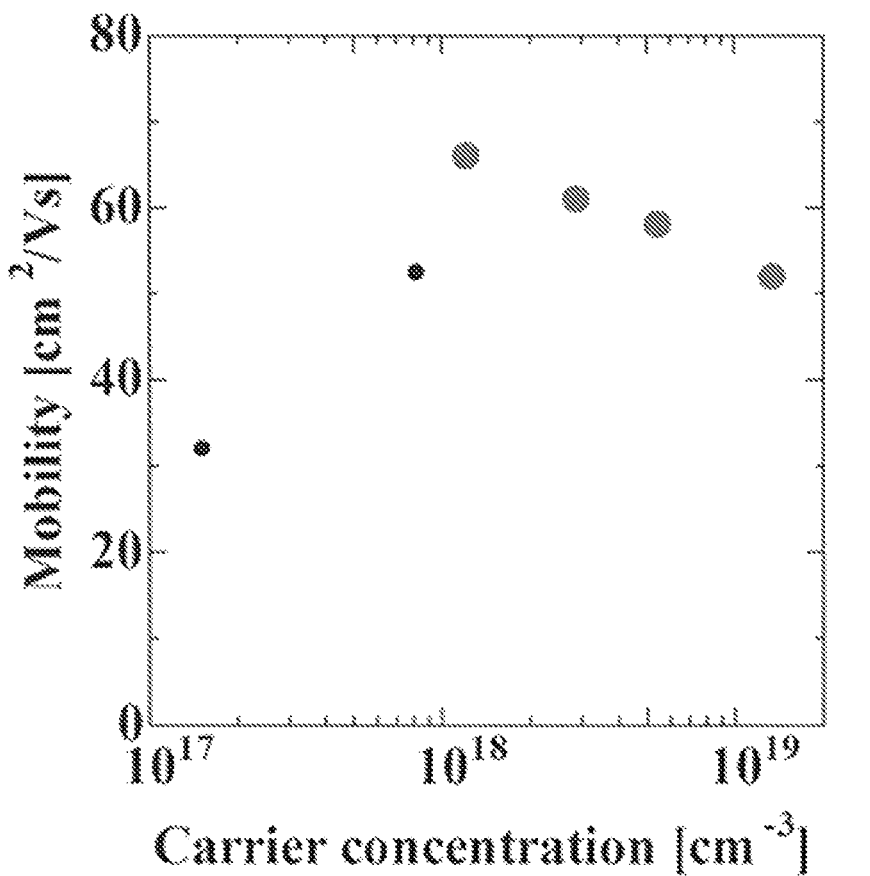
FIG. 13 shows a Hall effect measurement result of an Example. The vertical axis is mobility ($cm^2/Vs$), and the horizontal axis is carrier density ($/cm^3$).

Hall effect measurement by van der Pauw method was performed on an Sn-doped α-$Ga_2O_3$ film formed on an m-plane substrate, and mobility and carrier concentration were valued. Also, an α-$Ga_2O_3$ film was obtained under the same conditions as the conditions in the Example 1 except the following conditions that a raw material solution in that gallium acetylacetonate and tin (II) chloride dihydrate were mixed to be dissolved in ultrapure water while a small amount of hydrochloric acid was added to the ultrapure water was prepared, an m-plane sapphire substrate was used, and the film-formation temperature was set to be 500° C. In this occasion, two or more raw material solutions were prepared to have carrier concentration adjusted to be around $1\times10^{18}/cm^3$ by changing the mixing ratio of tin (II) chloride dihydrate, and two or more α-$Ga_2O_3$ films were obtained from the raw material solutions and evaluated. The results of the Hall effect measurements are shown in FIG. 13. As clearly shown in FIG. 13, mobility tends to decrease in accordance with the decrease of carrier concentration in the area of low carrier concentration that is lower than the carrier concentration $1\times10^{18}/cm^3$ (shown as smaller dots), however, such a tendency is not shown in the area of $1\times10^{18}/cm^3$ or high carrier concentration area (shown as bigger dots) and good electrical properties are indicated.

Test Example 6

Figure 14:
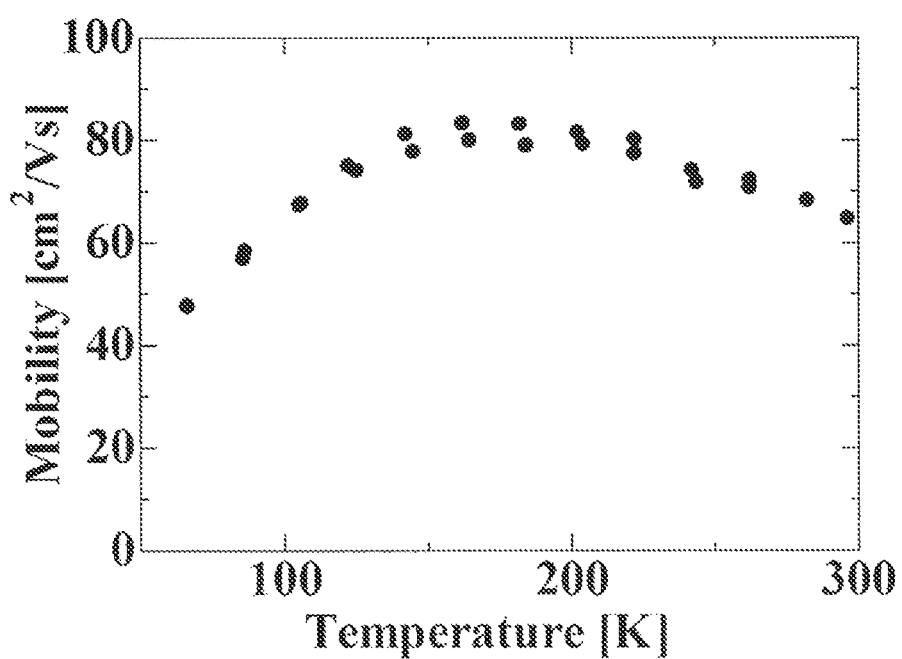
FIG. 14 shows a temperature-variable Hall effect measurement result of an Example. The vertical axis is mobility ($cm^2/Vs$), and the horizontal axis is temperature (K).

Also, temperature characteristics of mobility were examined on the α-$Ga_2O_3$ film having carrier concentration of $1.1\times10^{18}$ $cm^{-3}$ and obtained in the Test Example 5 by use of a variable temperature hall effect measurement system. The results are shown in FIG. 14. As clearly shown in FIG. 14, the mobility is 40 cm$^2$/Vs or more even in a low temperature region, and also, it is clearly shown that the film has enhanced electrical properties even in a high temperature region.

Example 22

1. Film (Layer) Formation Apparatus

Figure 15:
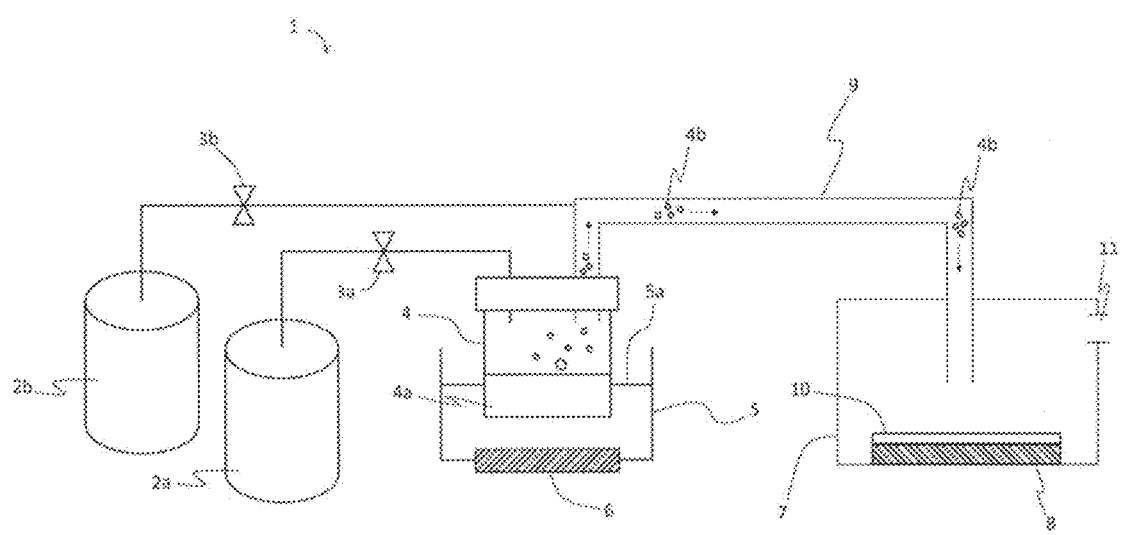
FIG. 15 shows a schematic view of a film-formation apparatus (mist CVD apparatus) used in an Example.

FIG. 15 shows a mist CVD apparatus 1 used in this example. The mist CVD apparatus 1 includes a carrier gas supply device 2a, a first flow-control valve 3a to control a flow of a carrier gas that is configured to be sent from the carrier gas supply device 2a, a diluted carrier gas supply device 2b, a second flow-control valve 3b to control a flow of a carrier gas that is configured to be sent from the diluted carrier gas supply device 2b, a mist generator 4 in that a raw material solution 4a is contained, a container 5 in that water 5a is contained, an ultrasonic transducer that may be attached to a bottom surface of the container 5, a film-formation chamber 7, a supply pipe 9 that connects the mist generator 4 to the film-formation chamber 7, a hot plate 8 arranged in the film-formation chamber 7, and an exhaust port 11 for exhausting the atomized droplets after the thermal reaction. A base 10 is placed on the hot plate 8.

2. Preparation of a Raw-Material Solution

Gallium bromide and tin chloride are mixed in ultrapure water to be a raw material solution under the conditions in that the atomic ratio of gallium to tin is to be 1:0.08 and gallium is to be 0.1 mol/L in an aqueous solution which contains hydrobromic acid that is to be 20% by volume ratio.

3. Preparation of Film-Formation

The raw-material solution 4a obtained at 2. the Preparation of the Raw-Material Solution above was set in the mist generator 4. Then, α-Ga$_2$O$_3$ film (non-doped) arranged as a buffer layer on an m-plane sapphire substrate (with an off-angle of 2.0°) as a base 20 was placed on the hot plate 8, and the hot plate 28 was activated to raise the temperature of the base up to 410° C. The first flow-control valve 3a and the second flow-control valve 3b were opened to supply a carrier gas from the carrier gas source 2a and the diluted carrier gas source 2b, which are the source of carrier gas, into the film-formation chamber 7 to replace the atmosphere in the film-formation chamber 7 with the carrier gas sufficiently. After the atmosphere in the film-formation chamber 7 was sufficiently replaced with the carrier gas, the flow rate of the carrier gas from the carrier gas source was regulated at 0.6 L/min. and the diluted carrier gas from the diluted carrier gas source was regulated at 1.0 L/min. Also, nitrogen was used as the carrier gas.

4. Formation of a Semiconductor Film

Next, the ultrasonic transducer 6 was vibrated at 2.4 MHz, and the vibrations were propagated through the water 5a to the raw material solution 4a to atomize the raw material solution 4a to form atomized droplets. The atomized droplets that were introduced through the supply pipe 9 into the film-formation chamber 7 with the carrier gas were thermally reacted under atmospheric pressure to form a film on the base 20 at 410° C. The film that was obtained was 20 μm in film thickness. The film formation time was 150 minutes.

Comparative Example 4

A crystalline oxide semiconductor film was obtained by the same conditions as the conditions of the Example 22 except the following condition that a c-plane sapphire substrate (with an off-angle of 0.2°) without a buffer layer on the c-plane sapphire substrate was used instead of an α-Ga$_2$O$_3$ (non-doped) as a buffer layer formed on an m-plane sapphire substrate. The crystalline oxide semiconductor film obtained herein was 2.0 μm in film thickness.

Example 23

A crystalline oxide semiconductor film was obtained by the same conditions as the conditions of the Example 22 except the following condition that the flow rate of carrier gas was set to be 0.9 L/min.

Comparative Example 5

A crystalline oxide semiconductor film was obtained by the same conditions as the conditions of the Example 23 except the following condition that a c-plane sapphire substrate (with an off-angle of 0.2°) without a buffer layer on a surface of the c-plane sapphire substrate was used instead of an α-Ga$_2$O$_3$ (non-doped) arranged on an m-plane sapphire substrate being used.

Text Example 7

Figure 16:
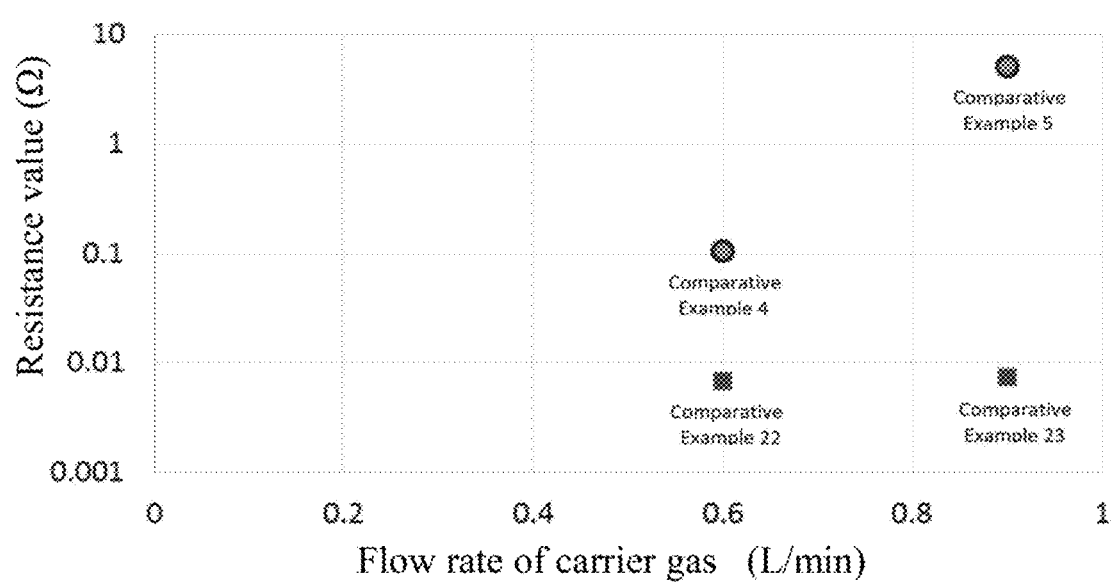
FIG. 16 shows a measurement result of the resistance value in the Examples and Comparative Examples.

Phases of the crystalline oxide semiconductor films obtained in Examples 22 to 23 and Comparative Examples 4 to 5 were identified under the same conditions as the conditions in the Test Example 1. All of the crystalline oxide semiconductor films obtained in the Examples 22 to 23 were m-plane α-Ga$_2$O$_3$, and all of the crystalline oxide semiconductor films obtained in the Comparative Examples 4 to 5 were c-plane α-Ga$_2$O$_3$. Using a tester, resistivity of the crystalline oxide semiconductor films obtained in the Examples 22 to 23 and in Comparative Examples 4 to 5 were measured. The results are shown in FIG. 16. As clearly shown in FIG. 16, the m-plane α-Ga$_2$O$_3$ film containing an n-type dopant (tin) is superior in electrical properties to the c-plane α-Ga$_2$O$_3$ film containing an n-type dopant (tin).

Example 24

A crystalline oxide semiconductor film was obtained by the same conditions as the conditions of the Example 22 except the following conditions that gallium bromide and germanium oxide were mixed in ultrapure water to be a raw material solution such that the atomic ratio of gallium to germanium is to be 1:0.01, gallium is to be 0.1 mol/L in aqueous solution which contains hydrobromic acid that is to be 10% by volume ratio, and the flow rate of carrier gas was set to be 1.0 L/min. The crystalline oxide semiconductor film that was obtained herein was 2.0 μm in film thickness.

Comparative Example 6

A crystalline oxide semiconductor film was obtained by the same conditions as the conditions of the Example 24 except the following conditions that a c-plane sapphire substrate (with an off-angle of 0.2°) was used as the base instead of α-Ga$_2$O$_3$ (non-doped) as a buffer layer arranged on a surface of an m-plane sapphire substrate being used.

Phases of the crystalline oxide semiconductor films obtained in Example 24 and in Comparative Example 6 were identified under the same conditions as the conditions in the Test Example 1. The crystalline oxide semiconductor film obtained in the Example 24 was an m-plane α-Ga$_2$O$_3$ film and the crystalline oxide semiconductor film obtained in the Comparative Example 6 was a c-plane α-Ga$_2$O$_3$ film. Using the same conditions as the conditions in the Test Example 7, resistivity of the crystalline oxide semiconductor films obtained in the Example 24 and in the Comparative Example 6 were measured. As the result, the same tendency as the result of the Test Example 7 was shown, and the m-plane α-Ga$_2$O$_3$ film containing an n-type dopant (germanium) was superior in electrical properties to the c-plane α-Ga$_2$O$_3$ film containing an n-type dopant (germanium).

INDUSTRIAL APPLICABILITY

A crystalline oxide semiconductor film according to the present inventive subject matter can be used in various fields for semiconductor devices (for example, compound semiconductor electronic devices), electronic parts, electrical equipment parts, optical electrophotographic related apparatuses, industrial members, and especially useful for semiconductor devices.

1 a mist CVD apparatus
2a a carrier gas supply source
2b a diluted carrier gas supply source
3a a flow-control valve of carrier gas
3b a flow-control valve of diluted carrier gas
4 a mist generator
4a a raw material solution
4b atomized droplets
5 a vessel
5a water
6 an ultrasonic transducer
7 a film-formation chamber
8 a hot plate
9 a supply tube
10 a substrate
11 an exhaust port
19 a mist CVD apparatus
20 a substrate
21 a susceptor
22a a carrier gas supply device
22b a carrier gas (diluted) supply device
23a a flow-control valve of carrier gas
23b a flow-control valve of diluted carrier gas
24 a mist generator
24a a raw material solution
25 a vessel
25a water
26 an ultrasonic transducer
27 a supply tube
28 a heater
29 an exhaust port
101a an n$^-$-type semiconductor layer
101b an n$^+$-type semiconductor layer
102 a p-type semiconductor layer
103 a semi-insulating layer
104 an electrically-insulating layer
105a a Schottky electrode
105b an Ohmic electrode
121a an n-type semiconductor layer with a wide band gap
121b an n-type semiconductor layer with a narrow band gap
121c an n$^+$-type semiconductor layer
123 a p-type semiconductor layer
124 a semi-insulating layer
125a a gate electrode
125b a source electrode
125c a drain electrode
128 a buffer layer
131a an n$^-$-type semiconductor layer
131b a first n$^+$-type semiconductor layer
131c a second n$^+$-type semiconductor layer
132 a p-type semiconductor layer
134 a gate insulating film
135a a gate electrode
135b a source electrode
135c a drain electrode
141a an n$^-$-type semiconductor layer
141b a first n$^+$-type semiconductor layer
141c a second n$^+$-type semiconductor layer
142 a p-type semiconductor layer
145a a gate electrode
145b a source electrode
145c a drain electrode
151 an n-type semiconductor layer
151a an n$^-$-type semiconductor layer
151b an n$^+$-type semiconductor layer
152 a p-type semiconductor layer
154 a gate insulating layer
155a a gate electrode
155b an emitter electrode
155c a collector electrode
161 an n-type semiconductor layer
162 a p-type semiconductor layer
163 a light-emitting layer
165a a first electrode
165b a second electrode
167 a light-transmitting electrode
169 a substrate

What is claimed is:

1. A crystalline oxide semiconductor film comprising:
a corundum-structured crystalline oxide semiconductor as a major component;
a principal plane that is an a-plane or an m-plane; and
a carrier concentration that is $1.0 \times 10^{18}$/cm$^3$ or more
wherein the crystalline oxide semiconductor film has a mobility that is 40 cm$^2$/Vs or more even in a low temperature region below 150 K.

2. The crystalline oxide semiconductor film of claim 1, wherein the crystalline oxide semiconductor film comprises a full width at half maximum of 300 arcsec or more.

3. The crystalline oxide semiconductor film of claim 1, wherein the crystalline oxide semiconductor film has electrical resistivity that is 50 mΩcm or less.

4. The crystalline oxide semiconductor film of claim 1, wherein the crystalline oxide semiconductor film comprises an off-angle.

5. The crystalline oxide semiconductor film of claim 1, wherein the crystalline oxide semiconductor film comprises a dopant that comprises tin, germanium, or silicon.

6. The crystalline oxide semiconductor film of claim 1, wherein the corundum-structured crystalline oxide semiconductor further comprises at least one of indium or aluminum.

7. A semiconductor device comprising:
at least an electrode and the crystalline oxide semiconductor film of claim 1 as a semiconductor layer.

8. A semiconductor system comprising:
the semiconductor device of claim 7.

9. The crystalline oxide semiconductor film of claim 1, wherein
the crystalline oxide semiconductor film has a mobility that is 60 cm$^2$/Vs or more in a temperature region of 150 K to 300 K.

10. The crystalline oxide semiconductor film of claim 1, comprising:
a surface area of at least 3 mm² without cracks.

11. A crystalline oxide semiconductor film comprising:
a corundum-structured crystalline oxide semiconductor as a major component;
a principal plane that is an m-plane; and
a carrier concentration that is $1.0 \times 10^{18}/cm^3$ or more wherein the crystalline oxide semiconductor film has a mobility that is 40 cm²/Vs or more even in a low temperature region below 150 K.

12. The crystalline oxide semiconductor film of claim 11, wherein the crystalline oxide semiconductor film comprises a dopant that comprises tin.

13. The crystalline oxide semiconductor film of claim 11, wherein
the principal plane is the m-plane with an off-angle inclined to a direction of an a-axis from the m-plane, and the crystalline oxide semiconductor film has a mobility that is 50 cm²/Vs or more.

14. The crystalline oxide semiconductor film of claim 11, wherein the crystalline oxide semiconductor film comprises an n-type dopant.

15. A semiconductor device comprising:
the crystalline oxide semiconductor film of claim 11;
a first electrode electrically connected to the crystalline oxide semiconductor film; and
a second electrode electrically connected to the crystalline oxide semiconductor film.

16. The crystalline oxide semiconductor film of claim 11, wherein
the crystalline oxide semiconductor film has an electrical resistivity that is 10 mΩcm or less.

17. A crystalline oxide semiconductor film comprising:
a corundum-structured crystalline oxide semiconductor as a major component;
a principal plane that is an m-plane with an off-angle inclined to the direction of the a-axis from the m-plane; and
a carrier concentration that is $1.0 \times 10^{18}/cm^3$ or more wherein the crystalline oxide semiconductor film has a mobility that is 40 cm²/Vs or more even in a low temperature region below 150 K .

18. The crystalline oxide semiconductor film of claim 17, wherein
the off-angle inclined to the direction of the a-axis from the m-plane is in a range of 0.5° to 3.0°.

19. The crystalline oxide semiconductor film of claim 18 comprising:
a mobility that is 90 cm²/Vs or more.

20. The crystalline oxide semiconductor film of claim 17, wherein the crystalline oxide semiconductor film has an electrical resistivity that is 10 mΩcm or less.

* * * * *